(12) United States Patent
Luniewski

(10) Patent No.: US 8,057,094 B2
(45) Date of Patent: Nov. 15, 2011

(54) POWER SEMICONDUCTOR MODULE WITH TEMPERATURE MEASUREMENT

(75) Inventor: Piotr Tomasz Luniewski, Soest (DE)

(73) Assignee: Infineon Technologies AG, Neubiberg (DE)

( * ) Notice: Subject to any disclaimer, the term of this patent is extended or adjusted under 35 U.S.C. 154(b) by 691 days.

(21) Appl. No.: 11/941,586

(22) Filed: Nov. 16, 2007

(65) Prior Publication Data

US 2009/0129432 A1    May 21, 2009

(51) Int. Cl.
   *G01N 25/20* (2006.01)
   *G01K 7/01* (2006.01)
   *G01K 7/21* (2006.01)
   *G01K 7/30* (2006.01)
   *G01K 1/12* (2006.01)

(52) U.S. Cl. ........ 374/178; 374/141; 374/172; 327/513; 702/130; 323/907; 361/93.8; 324/762.01; 257/467

(58) Field of Classification Search ........... 374/100, 374/141, 170–173, 178, 1–2, 4, 5, 57, 43–45, 374/29, 30, 137, 163, 183, 185, 166, 134; 702/130–136, 99; 327/512–513; 323/907; 340/501, 584; 361/93.8; 324/500, 762.01
See application file for complete search history.

(56) References Cited

U.S. PATENT DOCUMENTS

| | | | | |
|---|---|---|---|---|
| 4,001,649 A * | 1/1977 | Young | .................. | 361/106 |
| 4,157,466 A * | 6/1979 | Herrin | .................. | 219/210 |
| 4,730,228 A * | 3/1988 | Einzinger et al. | ............ | 361/103 |
| 4,860,165 A * | 8/1989 | Cassinelli | .................. | 361/710 |
| 5,101,315 A * | 3/1992 | Ishikawa et al. | ............ | 361/24 |
| 5,245,510 A * | 9/1993 | Honda | .................. | 361/718 |
| 5,313,150 A * | 5/1994 | Arakawa et al. | ............ | 318/768 |
| 5,483,102 A * | 1/1996 | Neal et al. | .................. | 257/712 |
| 5,563,760 A * | 10/1996 | Lowis et al. | .................. | 361/103 |
| 5,570,027 A * | 10/1996 | Stans et al. | .................. | 324/523 |
| 5,663,574 A * | 9/1997 | Hierold et al. | ............ | 257/48 |
| 5,696,543 A * | 12/1997 | Koizumi et al. | ............ | 347/17 |
| 5,721,455 A * | 2/1998 | Takashita | .................. | 257/713 |
| 5,886,515 A * | 3/1999 | Kelly | .................. | 323/313 |
| 6,092,927 A * | 7/2000 | Clemente | .................. | 374/163 |
| 6,144,246 A * | 11/2000 | Wachter | .................. | 327/513 |
| 6,717,788 B2 * | 4/2004 | Sommer et al. | ............ | 361/103 |
| 6,747,572 B2 * | 6/2004 | Bocko et al. | ............ | 340/870.16 |
| 6,787,870 B2 * | 9/2004 | Wienand et al. | ............ | 257/467 |
| 6,791,063 B2 * | 9/2004 | Manthe | .................. | 219/130.21 |
| 6,854,881 B2 * | 2/2005 | Nada | .................. | 374/169 |
| 7,304,264 B2 * | 12/2007 | Roy | .................. | 219/121.43 |
| 7,307,328 B2 * | 12/2007 | Meyer et al. | ............ | 257/467 |
| 7,396,156 B2 * | 7/2008 | Uraki | .................. | 374/44 |
| 7,448,797 B2 * | 11/2008 | Horn | .................. | 374/173 |
| 7,507,023 B2 * | 3/2009 | Oyabe et al. | .................. | 374/178 |
| 7,528,645 B2 * | 5/2009 | Scheikl et al. | ............ | 327/513 |

(Continued)

FOREIGN PATENT DOCUMENTS

| | | | |
|---|---|---|---|
| DE | 19959985 A1 | * | 7/2001 |
| DE | 10210181 C1 | * | 7/2003 |
| JP | 2007194442 A | * | 8/2007 |

*Primary Examiner* — Gail Verbitsky

(74) *Attorney, Agent, or Firm* — Dicke, Billig & Czaja, PLLC

(57) ABSTRACT

A power semiconductor module with temperature measurement is disclosed. One embodiment provides a conductor having a first end and a second end. The second end is thermally coupled at a substrate. A device including temperature sensor is thermally coupled at the first end and configured to determine a temperature at the second end using the temperature sensor.

17 Claims, 5 Drawing Sheets

U.S. PATENT DOCUMENTS

| | | |
|---|---|---|
| 2001/0048708 A1* | 12/2001 | Mikubo et al. .................. 374/43 |
| 2002/0167065 A1* | 11/2002 | Graf et al. ..................... 257/467 |
| 2004/0207965 A1* | 10/2004 | Ausserlechner ................ 361/56 |
| 2005/0197799 A1* | 9/2005 | Kamezawa et al. ........... 702/130 |
| 2005/0199999 A1* | 9/2005 | Shirasawa et al. ............ 257/706 |
| 2009/0024345 A1* | 1/2009 | Prautzsch ....................... 702/99 |
| 2009/0102493 A1* | 4/2009 | Disney et al. .................. 324/719 |
| 2009/0161726 A1* | 6/2009 | Miyamoto et al. ............ 374/172 |

* cited by examiner simplified thermal model

POWER SEMICONDUCTOR MODULE WITH TEMPERATURE MEASUREMENT

BACKGROUND

The application relates to power semiconductor modules, in particular to power semiconductor modules with temperature measurement capability.

An intelligent overheat protection is imperative in many power electronic applications. Temperature information may be used to prevent damage to electronic devices due to overtemperature. By using intelligent driver strategy for driving and controlling power electronic devices such overheating maybe avoided when over temperature is adequately detected.

Power semiconductor devices commonly used in power modules are, for example, IGBTs, MOSFETs, thyristors, diodes, rectifiers etc. In known power modules, NTC temperature sensors are also used and arranged close to the power semiconductor devices, for example, on an DCB ceramic substrate. This may be not desirable because of the space required on the DCB substrate. Electrical isolation may be an issue why temperature sensors on the DCB substrate are problematic. Furthermore, the number of electrical terminals in a module is usually limited, whereas a temperature sensor on the substrate would require at least two additional terminals.

There is a need for an improved power module with an alternative temperature measuring capability.

SUMMARY

One embodiment relates to a power module. One embodiment provides a conductor having a first end and a second end. The second end is thermally coupled at a substrate. A device including temperature sensor is thermally coupled at the first end and configured to determine a temperature at the second end using the temperature sensor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various example embodiments described herein may be combined with each other, unless specifically noted otherwise.

Figure 1A:
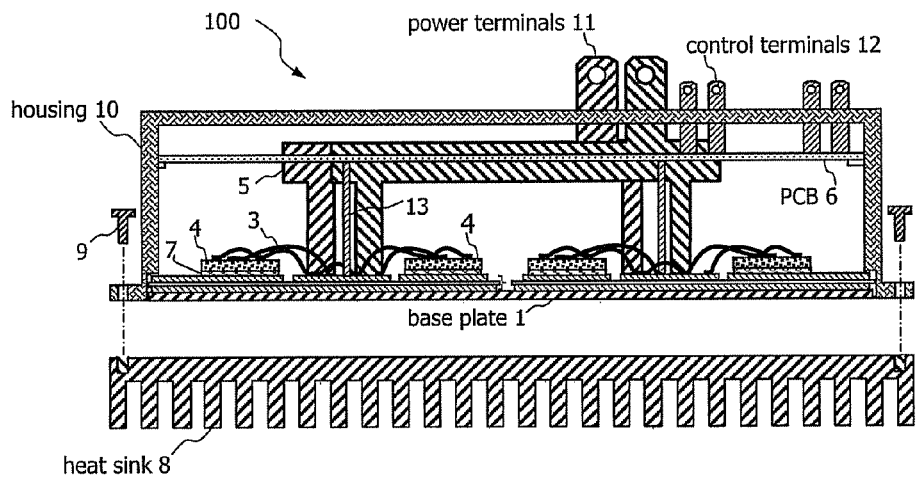
FIG. 1A is a cross-sectional view of an exemplary power semiconductor module with a base plate, DCB ceramic substrate, power semiconductor dice, an internal PCB board, power and control terminals, and a housing.

FIG. 1A illustrates a schematic cross-sectional view of an exemplary power module 100. The power module 100 includes a base plate 1 which, for example, is made of copper, a copper alloy, or metal matrix materials (e.g., AlSiC, CuSiC, AlC, CuC). However, semiconductor modules without a base plate are also applicable.

At least one substrate 2 is attached to the base plate 1. In the present example, the substrate includes an insulating ceramic layer 2a having a copper metallisation 2c arranged on its bottom surface and a patterned copper metallization 2b on its top surface forming a DCB-substrate. In another embodiment, the metallisation layers 2b, 2c may be made from aluminium forming together with the substrate a DAB-substrate. AMB (active metal braced) substrates may also be applicable. The substrate 2 is soldered to the base plate 1 or may be attached to it by using any other joining technique. In the case of a semiconductor module without a base plate the substrate also provides the function thereof.

The substrate 2 carries one or more power semiconductor devices 4 attached to the top metallization layer 2b of the substrate 2. The power bottom surface of the semiconductor devices 4 (e.g., IGBTs, power MOSFETs or the like) is soldered to metallisation layer 2b (solder layer 7), however, any other joining techniques may be applicable, for example, LTJT (low temperature joining technique) or the like. The top surface of the power semiconductor devices 4 may be connected to the metallization layer 2b of the substrate 2 by bond wires 3.

The power module further includes a circuit board 6, e.g., a standard printed circuit board (PCB), arranged above the substrate 2 and substantially parallel to the substrate 2 or to the base plate 1. The printed circuit board 6 typically carries driver circuitry (cf. reference symbol 14 in FIG. 2) for driving and controlling the power semiconductor devices 4. The driver circuitry is supplied with control signals via control terminals 12.

In the example of FIG. 1A, the power module 100 includes four power semiconductor devices 4 forming an IGBT half-bridge including two insulated gate bipolar transistors (IGBT) and two free-wheeling diodes (FWD). The driver circuitry may be configured to provide appropriate gate signals for the IGBTs dependent on the control signals supplied to the driver circuitry via control terminals 12. In order to supply the IGBTs 4 with the driver signals, a portion of the top metallisation layer 2b of substrate 2 may be connected to the driver circuitry on the printed circuit board 6 via auxiliary terminals denoted as conductor 13. The respective portion of the metallisation layer 2b may be connected to the gate and/or to the emitter of an IGBT 4 via bond wires. In another embodiment, conductor 13 may be connected to the IGBT chip thus directly connecting to the gate electrode on the chip.

The load terminals (e.g., the collector and the emitter of each IGBT, or drain and source of a MOSFET or anodes and cathodes of diodes or rectifiers, respectively, or of any other power semiconductor components) of the power semiconductor devices 4 may be connected to external power terminals 11 via electrically conductive connecting elements 5, metallisation layer 2b and bond wires 3. These connecting elements, for example, may be copper bars or the like.

The power semiconductor devices 4 and the printed circuit board 6 may be enclosed in a housing where base plate 1 may serve as a bottom portion of the housing. Additionally a heat sink 8 may be attached to the housing by using screws 9 such that the base plate 1, and thus the substrate 2, is in a good thermal contact with the heat sink 8. If only one substrate 2 is used in the power module 100, the substrate 2 may take over the function of the base plate and be directly connected to the heat sink 8. In this case a base plate 1 is not provided.

In the driver circuitry for the power semiconductor devices 4, temperature information of the base plate temperature, of the substrate temperature, or of the junction temperature in the power semiconductor device 4 itself may be processed. Therefore, a temperature sensor, for example a NTC (negative temperature coefficient) sensor may be attached to the substrate 2 which is undesirable in many applications for reasons discussed above in the introductory section.

FIG. 1A illustrates a module with the PCB 6 being arranged inside the module housing 10. However many modules do not have an internal circuit board but are only connected to an external circuit board. Therefore all the control terminals 12, power terminals 11 and, if necessary, auxiliary terminals 13 are guided through the housing to the outside of the module.

Figure 1B:
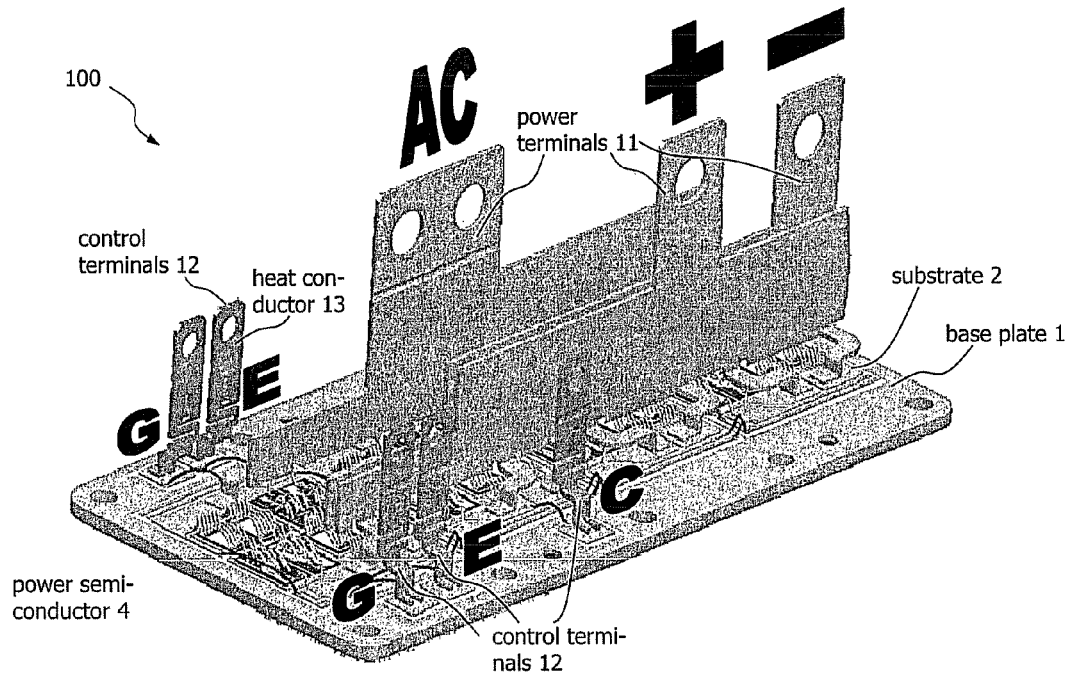
FIG. 1B illustrates a perspective view of another exemplary power module without an internal PCB and without a base plate. Power and control terminals are guided to the outside of the housing (not illustrated) for being connected to an external PCB.

FIG. 1B is a perspective view of a power semiconductor module without an internal PCB. The housing is not illustrated in order to facilitate illustration. A heat sink (not illustrated in FIG. 1B) may be attached to the base plate 1 in a similar way as it is attached to the base plate in the example of FIG. 1A. The terminals are made, for example, of copper, a copper alloy, aluminium or an aluminium alloy and thus provide good electrical and thermal conductivity. One of the control terminals 12 may be used as heat conductor 13 for temperature measurement as explained with reference to the following figures. However, a separate auxiliary terminal, which may not even provide an electrical function, may also be used as heat conductor 13.

Figure 2:
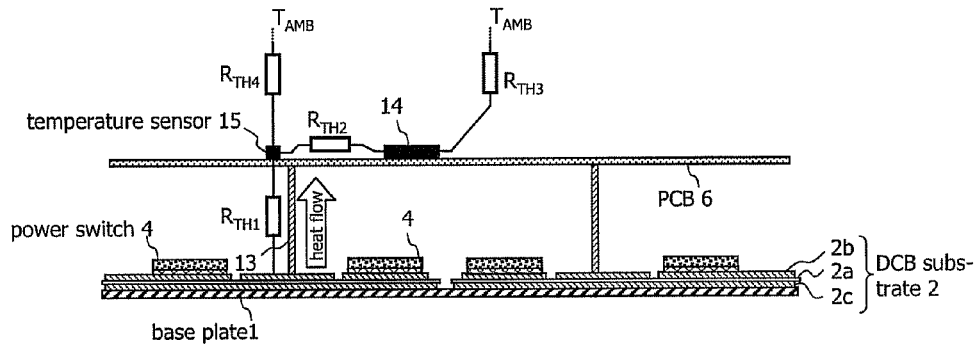
FIG. 2 illustrates a schematic view of a base plate with a DCB substrate arranged thereon and a printed circuit board (PCB) connected to the substrate via at least one auxiliary connector, the temperature sensor being arranged on the PCB adjacent to one end of the auxiliary connector.

FIG. 2 illustrates a power module with a novel temperature measuring capability where the housing 10, the power terminals 11, the control terminals 12, the connecting elements 5, and the bond wires 3 have been omitted for the sake of simplicity and clarity. As illustrated in FIG. 2, an auxiliary terminal (conductor 13) having a known thermal resistance $R_{TH1}$ is connected between the (internal or external) circuit board 6 and either the substrate 2 or a power semiconductor device 4, thus thermally coupling a temperature sensor 15 arranged on the circuit board 6 to the substrate 2 or the power semiconductor device 4, respectively. In order to enable a reliable temperature measurement the conductor 13 is a heat conducting element providing a low thermal resistance $R_{TH1}$ between circuit board 6 and the components at the bottom of the power module (i.e. power semiconductor device 4, or substrate 2, or base plate 1). Beside its thermal function the heat conducting element 13 may, but not necessarily has to, provide an electrical function. For example, the heat conductor 13 may also be an electrical conductor being electrically connected to the power semiconductor device 4, e.g., to the emitter of an IGBT in order to connect the driver circuitry arranged on the circuit board 6 with the emitter potential of the IGBT.

The driver circuitry arranged on the circuit board 6 is illustrated by device 14 in FIG. 2, whereby the circuit board 6 establishes a thermal resistance $R_{TH2}$ between the temperature sensor 15 and the driver circuitry 14, that includes, for example, gate resistors. As indicated by an arrow in FIG. 2 the main heat flow occurs from the bottom of the power module via the heat conductor 13 (e.g., made of copper, a copper alloy, aluminium or any other appropriate material) that has a thermal resistance $R_{TH1}$, to the temperature sensor 15 on the circuit board 6. However, heat is also dissipated in the driver circuitry 14, for example, in gate resistors connecting the driver circuitry 14 to the gate terminals of an IGBT 4. The thermal resistance between the driver circuitry 14 and the surrounding environment is modelled with a thermal resistor $R_{TH3}$.

Figure 3:
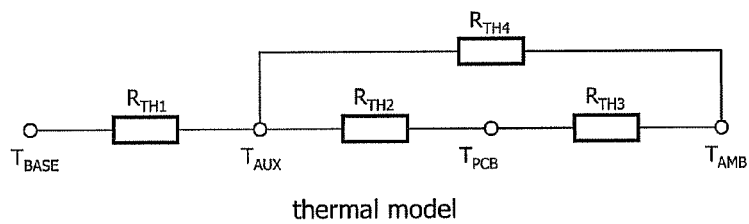
FIG. 3 illustrates a thermal model of the power module by using thermal resistors.

The thermal model of the temperature measurement system of the power module illustrated in FIG. 2 is illustrated in FIG. 3. The bottom end of the thermal conductor 13 that is connected to the substrate 2 or the power semiconductor device 4 has a temperature $T_{BASE}$. The temperature of the top end of the thermal conductor 13 is the temperature $T_{AUX}$ that is measured by the temperature sensor 15. The temperature of the hottest spot of the driver circuitry (e.g., the gate resistors) on the circuit board 6 is denoted by temperature $T_{PCB}$, and the ambient temperature is denoted by temperature $T_{AMB}$. The bottom end of the thermal conductor 13 (and the substrate 2 respectively) with temperature $T_{BASE}$ is coupled to the temperature sensor 15 (and to the top end of the heat conductor 13 respectively) via a thermal resistance $R_{TH1}$. The temperature sensor 15 is coupled to the hottest spot of the driver circuitry (e. g. the gate resistors) via a thermal resistance $R_{TH2}$, and the driver circuitry 14 is coupled to the having a temperature $T_{AMB}$ via a thermal resistor $R_{TH3}$. The thermal resistance between the temperature sensor 15 and the surrounding environment is denoted by $R_{TH4}$. In case the thermal resistance $R_{TH1}$ between the substrate 2 (or, the power semiconductor device 4, respectively) and the temperature sensor 15 is small compared to the thermal resistance $R_{TH2}$ between the temperature sensor 15 and the driver circuitry 14 (and the surrounding environment), i.e. $R_{TH1} \ll R_{TH2}$, and $R_{TH1} \ll R_{TH4}$, the temperature sensor 15 practically is thermally decoupled from heat sources in the driver circuitry 14. The temperature of the bottom end of the heat conductor 13 which is approximately the temperature of the substrate 2 or the power semiconductor switch 4, respectively, can be estimated from the temperature $T_{AUX}$ measured by the temperature sensor 15 via the thermal resistance $R_{TH1}$ In this case the approximation $$T_{AUX} \approx T_{BASE} \quad (1)$$

is valid.

Figure 4:
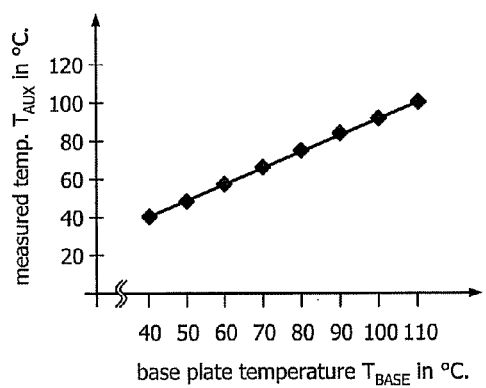
FIG. 4 illustrates the temperature of the auxiliary connector at the PCB as a function of the substrate temperature.

An experimentally obtained dependency of the temperature $T_{AUX}$ and the temperature $T_{BASE}$ of the substrate illustrated in the diagram of FIG. 4. One can see that the approximation in eq. (1) may be good for some applications, however, the measured temperature $T_{AUX}$ may deviate from the substrate temperature $T_{BASE}$ by about 10 percent. This is due to the thermal resistance $R_{TH4}$ between the temperature sensor 15 and the surrounding environment which likely has to be considered if a precise temperature measurement is desired. The influence of the ambient temperature (via thermal resistor $R_{TH4}$) is discussed in more detail later with reference to FIGS. 6 to 11.

In the case the thermal resistance $R_{TH2}$ between temperature sensor 15 and driver circuitry 14 is not high enough to allow for neglecting the influence of heat sources within the driver circuitry 14, the temperature $T_{AUX}$ measured by temperature sensor 15 is not only influenced by the temperature of the substrate 2 or the semiconductor switch 4 but also by the temperature $T_{PCB}$ of the driver circuitry 14 thus falsifying temperature estimations of the substrate temperature $T_{BASE}$ (or the junction temperature of the power semiconductor device 4, respectively). In order to compensate for the influence of a heat source on the PCB board within the driver circuitry 14 a second temperature measurement may be performed as discussed with reference to FIG. 5.

Figure 5:
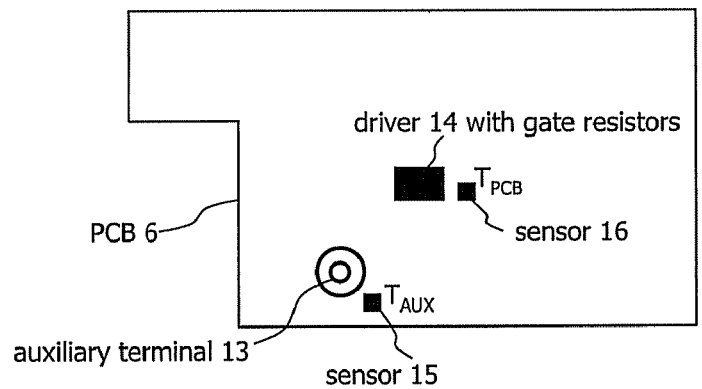
FIG. 5 illustrates a top view of a PCB illustrating the position of the temperature sensor and of the driver circuits including gate resistors.

FIG. 5 illustrates a top view of the circuit board 6 of power module 100 illustrated in FIG. 2. In this example a further temperature sensor 16 is arranged on the circuit board 6 adjacent and thermally coupled to the "hot spot" in the driver circuitry 14 measuring the temperature $T_{PCB}$ of the driver circuitry 14. With this second temperature information the influence of the heat source in the driver circuitry 14 to the temperature $T_{AUX}$ measured by the temperature sensor 15 can be compensated for and a correct value for the substrate temperature $T_{BASE}$ (or the temperature of the semiconductor device) may be calculated. Assuming $R_{TH4} \gg R_{TH1}$, $R_{TH4} \gg R_{TH2}$, $R_{TH3} \gg R_{TH1}$ and $R_{TH3} \gg R_{TH2}$, the substrate temperature can be calculated according to the following equation:

$$T_{BASE} = (k \cdot T_{PCB} - T_{AUX})/(k-1) \text{ for } k = R_{TH1}/(R_{TH1}+R_{TH2}) \quad (2)$$

That is, the thermal resistance $R_{TH4}$ between the surrounding environment and the temperature sensor 15 and the thermal resistance $R_{TH3}$ between the surrounding environment and the driver circuitry 14 are high and thus negligible. This is the case, if the driver circuitry 14 includes a considerable heat source that dominates heat flow on the PCB 6.

Figure 6:
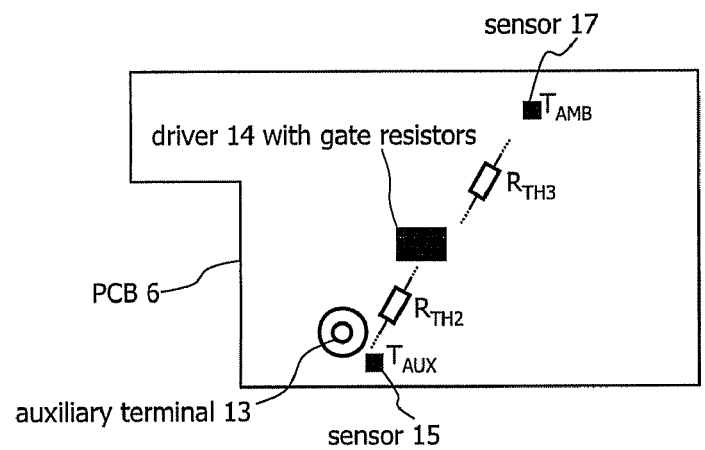
FIG. 6 illustrates a top view of a PCB illustrating an alternative to the arrangement of FIG. 5.

In practice it often may be desirable to measure the ambient temperature $T_{AMB}$ instead of the temperature $T_{PCB}$ of the river circuitry 14. FIG. 6 illustrates a further example of the invention where a further temperature sensor 17 is arranged distant to temperature sensor 15 and distant to the driver circuitry 14 in order to provide a reliable measurement value for the ambient temperature $T_{AMB}$. With given values for the thermal resistors $R_{TH1}$, $R_{TH2}$, $R_{TH3}$ and $R_{TH4}$, the measured temperature value $T_{AUX}$ measured by temperature sensor 15, and the ambient temperature $T_{AMB}$ measured by further temperature sensor 17 it is possible to provide a correct estimation for temperature $T_{BASE}$ of the substrate 2 (or the junction temperature of the power semiconductor device 4). More detailed examples of the invention using this configuration is discussed with reference to FIGS. 8 to 11.

Figure 7:
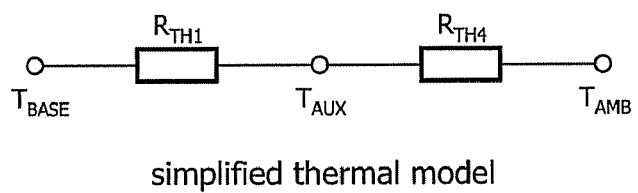
FIG. 7 illustrates a simplified thermal model compared to the model of FIG. 4 some resistors can be neglected.

FIG. 7 illustrates a simplified thermal model of the power semiconductor module. The simplified model can be derived from the model of FIG. 3 by neglecting thermal resistors $R_{TH2}$ and $R_{TH3}$. This assumption is valid if $R_{TH1} \ll R_{TH2}$ and the series circuit of $R_{TH2}$ and $R_{TH3}$ is negligible. That is, the ambient temperature $T_{AMB}$ is responsible for the dominant heat flow on the PCB 6 in this example. Then the substrate temperature $T_{BASE}$ may be calculated according to the following equation:

$$T_{BASE} = (k \cdot T_{AMB} - T_{AUX})/(k-1) \text{ for } k = R_{TH1}/(R_{TH1}+R_{TH4}). \quad (3)$$

Figure 8:
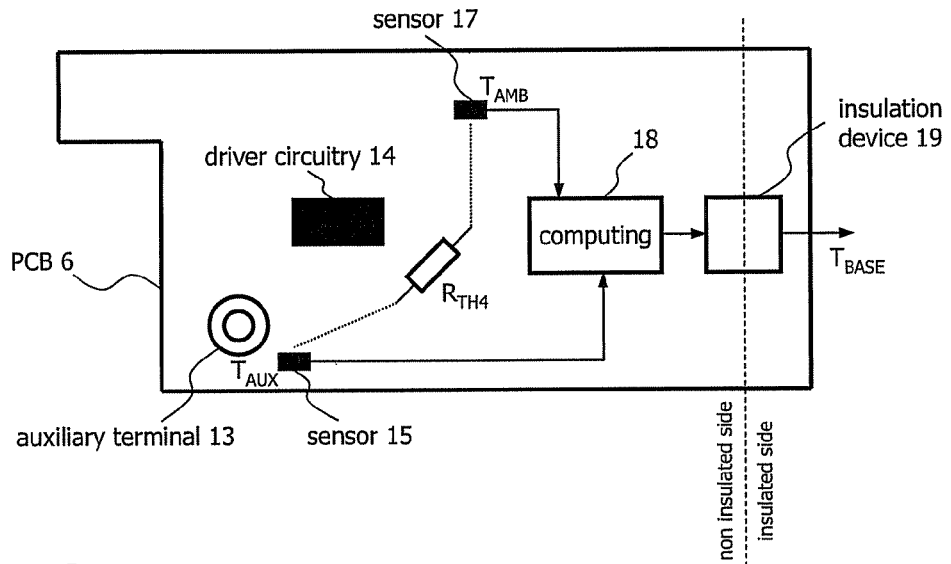
FIG. 8 illustrates the example of FIG. 6 in more detail, wherein a galvanic isolation of a portion of the PCB is provided and the sensors and the signal processing are arranged on the non isolated side.
Figure 9:
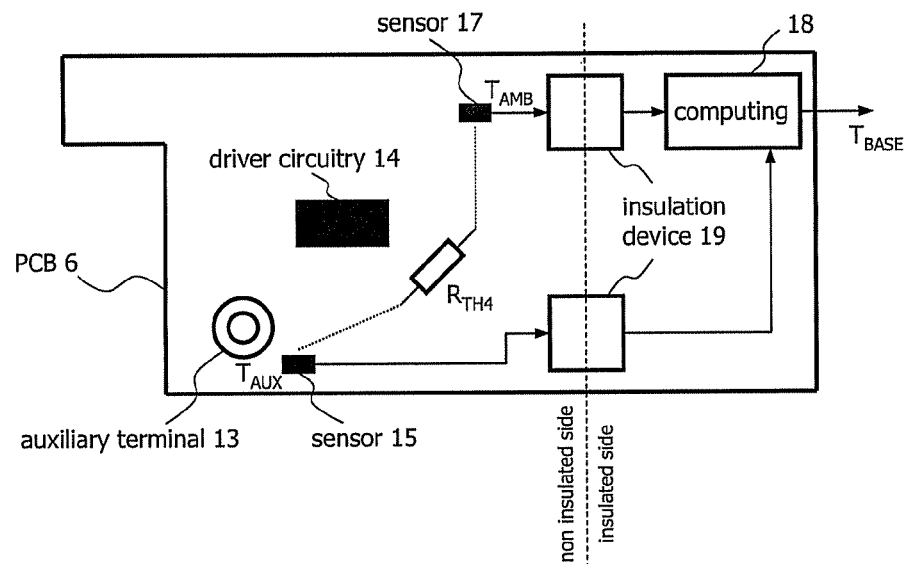
FIG. 9 illustrates an example similar to the example of FIG. 8, where the signal processing is arranged on the isolated side, whereas the sensors are arranged on the non isolated side of the PCB.
Figure 10:
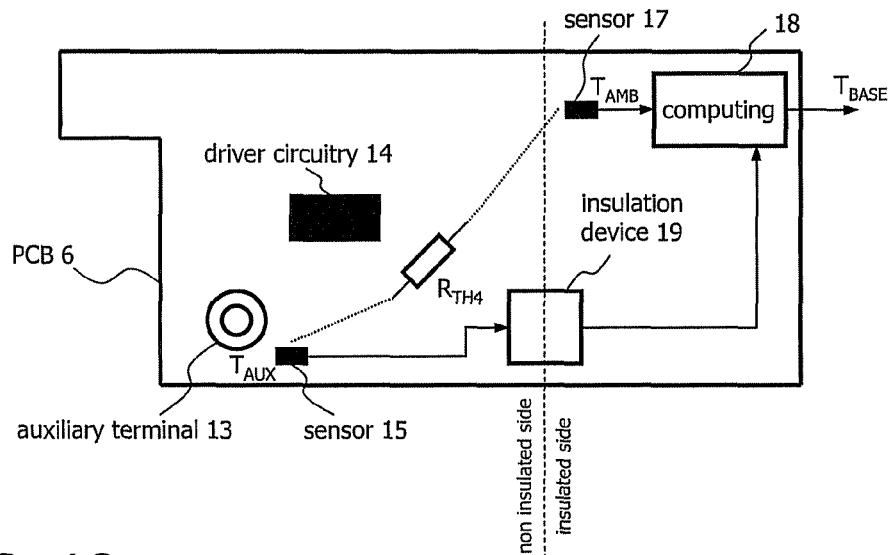
FIG. 10 illustrates an example similar to the example of FIG. 8, where the signal processing and the sensor for the ambient temperature are arranged on the isolated side of the PCB.

The measurement may be implemented using a set-up as illustrated in FIGS. 8 to 10 which are based on the basic set-up of FIG. 6.

FIG. 8 illustrates the example of FIG. 6. in more detail. In many applications a galvanic isolation is provided to separate external circuits and part of the circuitry arranged on the PCB 6. from the power semiconductor devices 4 on the substrate 2. The galvanic isolation may, for example, be provided by using transformers (e.g., integrated coreless transformers) or optocouplers or by any other appropriate means. In this context the circuitry having direct electrical contact to the power electronic devices is the to be on the "non isolated side", whereas the external circuitry and parts of the circuitry on the PCB 6 is on the "isolated side".

The PCB 6 of FIG. 8 includes the temperature sensor 15 for measuring the temperature $T_{AUX}$ of the heat conductor 13 (e.g., an emitter terminal of the IGBT arranged on the substrate 2, cf. FIG. 1B), the temperature sensor 17 for measuring the ambient temperature $T_{AMB}$, the driver circuitry 14 for driving the semiconductor devices, a computing unit 18, (for example a micro controller), and an isolation device 19 for providing the above mentioned galvanic isolation. The temperature sensor 17 for measuring the ambient temperature $T_{AMB}$ is arranged on the PCB 6 distant from the heat conductor 13. The PCB has to be designed such that the temperature sensor 17 is thermally decoupled from the driver circuitry 14 and from the heat conductor 13. If this is the case, the temperature of the sensor 17 is (at least approximately) equal to ambient temperature $T_{AMB}$, and the substrate temperature can be calculated according to eqn. (2) provided that $R_{TH2} \gg R_{TH1}$.

The calculation is performed by the computing unit 18. The calculation result is output and transferred to the isolated side of the PCB 6 via the insulation device 19 for further processing.

The example of FIG. 9 corresponds to the example of FIG. 8 with the only difference that the computing unit 18 is arranged on the isolated side of the PCB 6. In this case the output signals of the temperature sensors 15, 17 have to be transferred to the isolated side of the PCB in order to be sullied to the computing unit 18.

The example of FIG. 10 corresponds to the example of FIG. 9 with the only difference that the ambient temperature measurement entirely takes place on the isolated side. In this case only one isolation device 19 is needed for the output signal of temperature sensor 15. Additionally the thermal resistance RTH3 is increased and its influence thus reduced since sensor 17 can be arranged even more distant from the driver circuitry 14 than in the example of FIG. 9.

Figure 11:
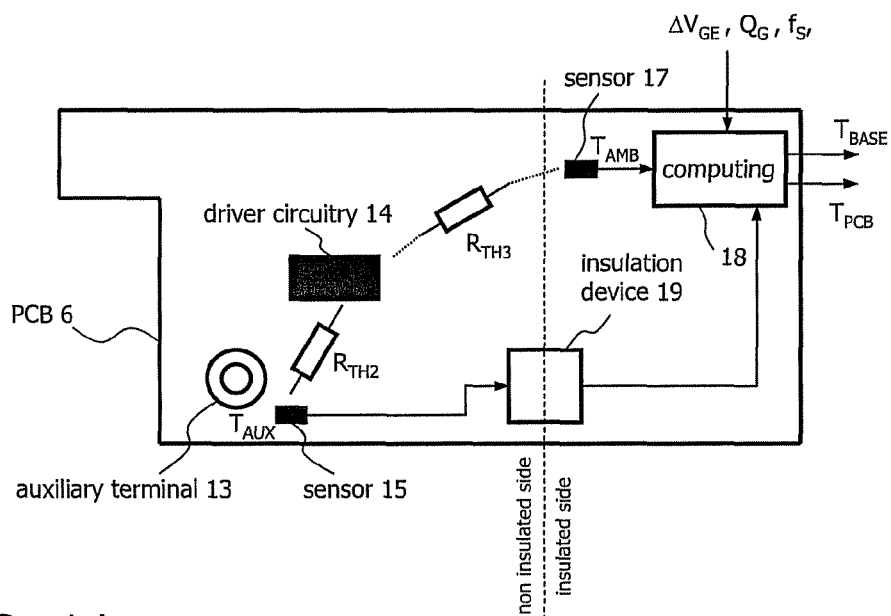
FIG. 11 illustrates a further example based on the example of FIG. 10, wherein an estimation of the temperature of the driver circuitry is provided by the signal processing.

The example of FIG. 11 corresponds to the example of FIG. 10 with the only difference that another thermal model is used for calculation of the sought substrate temperature $T_{BASE}$. In this case it is assumed that $R_{TH4} \gg (R_{TH2}+R_{TH3})$, and therefore $R_{TH4}$ is negligible in the thermal model illustrated in FIG. 3. This assumption is valid if the driver circuitry 14 (e.g., the gate resistors) dominates the heat flow on the PCB 6. Consequently the power losses $P_{DIS}$ dissipated, for example, in the gate resistors in the driver circuitry 14 has to be considered in the calculations of the substrate temperature $T_{BASE}$. The power losses $P_{DIS}$ in the gate resistors, that is the heat generated per unit of time, may be estimated according to the following equation:

$$P_{DIS} = \Delta V_{GE} \cdot Q_G \cdot f_S, \quad (4)$$

Where $\Delta V_{GE}$ is the driver output voltage swing applied to the gate resistors with respect to the emitter potential of the driven IGBT 4, $Q_G$ is the gate charge transported the IGBT in response to the output voltage swing $\Delta V_{GE}$, and $f_S$ is the switching frequency of the IGBT. The substrate temperature is then calculated according to $$T_{BASE} = \frac{T_{AUX} \cdot (R_{TH1} + R_{TH2} + R_{TH3}) - R_{TH1} \cdot (T_{AMB} + R_{TH3} \cdot P_{DIS})}{R_{TH2} + R_{TH3}} \quad (5)$$

The set-ups illustrated in FIG. 11 also allows for calculation of the temperature $T_{PCB}$ of the "hot spot" on the PCB 6 (e.g., gate resistors in driver circuitry 14) according to the following equation:

$$T_{PCB} = (R_{TH1} + R_{TH2}) \cdot \frac{R_{TH3} \cdot P_{DIS} + T_{AMB} - T_{BASE}}{R_{TH1} + R_{TH2} + R_{TH3}} + T_{BASE} \quad (6)$$

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power module comprising:
a power semiconductor device couple to a substrate;
a conductor having a predetermined thermal resistance and including a first end and a second end, the second end being thermally coupled at the substrate;
a temperature sensor being thermally coupled to the first end of the conductor and being configured to measure the temperature at the first end; and
a unit configured to determine the temperature of the second end of the conductor by adjusting the measured temperature of the first end based on the predetermined thermal resistance of the conductor, wherein the temperature of the second end is representative of a temperature of the power semiconductor device.

2. The power module of claim 1, further comprising:
a circuit board arranged above the substrate; and
wherein the first end of the conductor and the temperature sensor are thermally coupled via the circuit board.

3. The power module of claim 1, comprising wherein the conductor is made of copper or a copper alloy.

4. The power module of claim 1, comprising wherein the conductor has the shape of a bar, a rod or a beam.

5. The power module of claim 1, comprising wherein the conductor is electrically connected to a load terminal of the power semiconductor device.

6. The power module of claim 5, comprising wherein the power semiconductor device is a power transistor having an emitter or a source and the conductor is electrically connected to the emitter or, respectively, to the source thereof.

7. A power module comprising:
a power semiconductor device couple to a substrate;
a conductor having a thermal resistance and including a first end and a second end, the second end being thermally coupled at the substrate;
a temperature sensor being thermally coupled to the first end of the conductor and being configured to measure the temperature at the first end;
a unit configured to determine the temperature of the second end of the conductor using the measured temperature of the first end of the conductor and the thermal resistance of the conductor;
a circuit board arranged above the substrate, wherein the first end of the conductor and the temperature sensor are thermally coupled via the circuit board;
driver circuitry for the power semiconductor device arranged on the printed circuit board; and
a further temperature sensor being thermally coupled to the driver circuitry and being configured to measure the temperature thereof; and
wherein the unit is configured to estimate the temperature of the second end of the conductor using the measured temperature of the first end of the conductor, the measured temperature of the driver circuitry and the thermal resistance of the conductor.

8. A power module comprising:
a power semiconductor device couple to a substrate;
a conductor having a thermal resistance and including a first end and a second end, the second end being thermally coupled at the substrate;
a temperature sensor being thermally coupled to the first end of the conductor and being configured to measure the temperature at the first end;
a unit configured to determine the temperature of the second end of the conductor using the measured temperature of the first end of the conductor and the thermal resistance of the conductor;
a circuit board arranged above the substrate, wherein the first end of the conductor and the temperature sensor are thermally coupled via the circuit board;
driver circuitry for the power semiconductor device arranged on the printed circuit board; and
a further temperature sensor being arranged on the circuit board such that it is not thermally coupled to the driver circuitry or to the first end of the conductor and thus being configured to measure an ambient temperature; and
wherein the unit is configured to estimate the temperature of the second end of the conductor using the measured temperature of the first end of the conductor, the measured ambient temperature and the thermal resistance of the conductor.

9. A power module comprising:
- at least one substrate;
- at least one power semiconductor device attached to the substrate;
- a conductor having a predetermined thermal resistance and comprising a first end and a second end, the second end being thermally coupled to the substrate or to the power semiconductor device;
- a temperature sensor being thermally coupled to the first end of the conductor and being configured to measure the temperature thereof; and
- an estimating unit configured to estimate the temperature of the second end of the conductor by adjusting the measured temperature of the first end of the conductor based on the predetermined thermal resistance of the conductor, wherein the temperature of the second end is representative of a temperature of the power semiconductor device.

10. The power module of claim 9, further comprising:
- a circuit board arranged above the substrate; and
- wherein the first end of the conductor and the temperature sensor are attached to the circuit board such that they are thermally coupled.

11. The power module of claim 9, comprising wherein the conductor is made of copper or a copper alloy.

12. The power module of claim 9, comprising wherein the conductor has the shape of a bar, a rod or a beam.

13. The power module of claim 9, comprising wherein the conductor is electrically connected to a load terminal of the power semiconductor device.

14. The power module of claim 13, comprising wherein the power semiconductor device is a power transistor having an emitter or a source and the conductor is electrically connected to the emitter or, respectively, to the source thereof.

15. A power module comprising:
- at least one substrate;
- at least one power semiconductor device attached to the substrate;
- a conductor having a thermal resistance and comprising a first end and a second end, the second end being thermally coupled to the substrate or to the power semiconductor device;
- a temperature sensor being thermally coupled to the first end of the conductor and being configured to measure the temperature thereof; and
- an estimating unit configured to estimate the temperature of the second end of the conductor using the measured temperature of the first end of the conductor and the thermal resistance of the conductor;
- a circuit board arranged above the substrate, wherein the first end of the conductor and the temperature sensor are attached to the circuit board such that they are thermally coupled;
- driver circuitry for the power semiconductor device arranged on the printed circuit board; and
- a further temperature sensor being thermally coupled to the driver circuitry and being configured to measure the temperature thereof; and
- wherein the estimating unit is configured to estimate the temperature of the second end of the conductor using the measured temperature of the first end of the conductor, the measured temperature of the driver circuitry and the thermal resistance of the conductor.

16. A power module comprising:
- at least one substrate;
- at least one power semiconductor device attached to the substrate;
- a conductor having a thermal resistance and comprising a first end and a second end, the second end being thermally coupled to the substrate or to the power semiconductor device;
- a temperature sensor being thermally coupled to the first end of the conductor and being configured to measure the temperature thereof; and
- an estimating unit configured to estimate the temperature of the second end of the conductor using the measured temperature of the first end of the conductor and the thermal resistance of the conductor;
- a circuit board arranged above the substrate, wherein the first end of the conductor and the temperature sensor are attached to the circuit board such that they are thermally coupled;
- driver circuitry for the power semiconductor device arranged on the printed circuit board; and
- a further temperature sensor being arranged on the circuit board such that it is not thermally coupled to the driver circuitry or to the first end of the conductor and thus being configured to measure an ambient temperature; and
- wherein the estimating unit is configured to estimate the temperature of the second end of the conductor using the measured temperature of the first end of the conductor, the measured ambient temperature and the thermal resistance of the conductor.

17. A power module comprising:
- a power semiconductor device couple to a substrate;
- a conductor having a thermal resistance and including a first end and a second end, the second end being thermally coupled at the substrate;
- a temperature sensor being thermally coupled to the first end of the conductor and being configured to measure the temperature at the first end;
- a unit configured to determine the temperature of the second end of the conductor using the measured temperature of the first end of the conductor and the thermal resistance of the conductor;
- a circuit board arranged above the substrate, wherein the first end of the conductor and the temperature sensor are thermally coupled via the circuit board;
- a further temperature sensor being arranged on the circuit board such that it is not thermally coupled to the first end of the conductor and thus being configured to measure the ambient temperature; and
- wherein the unit is configured to estimate the temperature of the second end of the conductor using the measured temperature of the first end of the conductor, the measured ambient temperature and the thermal resistance of the conductor.

* * * * *